(12) United States Patent
You et al.

(10) Patent No.: US 10,403,844 B2
(45) Date of Patent: Sep. 3, 2019

(54) ORGANIC LIGHT-EMITTING ELEMENT

(71) Applicant: LG DISPLAY CO., LTD., Seoul (KR)

(72) Inventors: Jina You, Daejeon (KR); Min Choon Park, Daejeon (KR); Jeamin Moon, Daejeon (KR); Mun Kyu Joo, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/944,104

(22) Filed: Apr. 3, 2018

(65) Prior Publication Data

US 2018/0226603 A1 Aug. 9, 2018

Related U.S. Application Data

(63) Continuation of application No. 14/909,014, filed as application No. PCT/KR2014/008655 on Sep. 17, 2014, now Pat. No. 9,966,552.

(30) Foreign Application Priority Data

Sep. 17, 2013 (KR) ........................ 10-2013-0112124

(51) Int. Cl.
  *H01L 51/50* (2006.01)
  *C09K 11/02* (2006.01)
  *H01L 27/32* (2006.01)
  *H01L 51/00* (2006.01)
  *H01L 51/52* (2006.01)

(52) U.S. Cl.
  CPC ........ *H01L 51/5076* (2013.01); *C09K 11/025* (2013.01); *H01L 27/3244* (2013.01); *H01L 51/006* (2013.01); *H01L 51/0052* (2013.01); *H01L 51/0059* (2013.01); *H01L 51/0072* (2013.01); *H01L 51/0085* (2013.01); *H01L 51/0097* (2013.01); *H01L 51/5004* (2013.01); *H01L 51/508* (2013.01); *H01L 51/5016* (2013.01); *H01L 51/5278* (2013.01); *H01L 2251/5338* (2013.01); *H01L 2251/552* (2013.01); *H01L 2251/558* (2013.01)

(58) Field of Classification Search
  None
  See application file for complete search history.

(56) References Cited

U.S. PATENT DOCUMENTS

| | | |
|---|---|---|
| 2004/0211971 A1 | 10/2004 | Takei et al. |
| 2006/0040132 A1 | 2/2006 | Liao et al. |
| 2007/0046189 A1 | 3/2007 | Hatwar et al. |
| 2007/0141395 A1 | 6/2007 | Chun et al. |
| 2007/0221912 A1 | 9/2007 | Jeong et al. |

(Continued)

FOREIGN PATENT DOCUMENTS

| | | |
|---|---|---|
| CN | 101005116 A | 7/2007 |
| CN | 102067730 A | 5/2011 |

(Continued)

*Primary Examiner* — Vu A Nguyen
(74) *Attorney, Agent, or Firm* — Dentons US LLP

(57) ABSTRACT

The present application describes an organic light emitting device including a first layer, a second layer, and a third layer between a cathode and a light emitting layer or between light emitting units, in which the first layer includes an n-type organic material or metal oxide, the second layer includes a barrier material, and the third layer includes an n-type dopant.

25 Claims, 14 Drawing Sheets

(56) References Cited

U.S. PATENT DOCUMENTS

| | | |
|---|---|---|
| 2008/0136339 A1 | 6/2008 | Matsuura et al. |
| 2010/0288362 A1 | 11/2010 | Hatwar et al. |
| 2010/0301317 A1 | 12/2010 | Nowatari et al. |
| 2011/0079774 A1 | 4/2011 | Kang et al. |
| 2011/0215307 A1 | 9/2011 | Nowatari et al. |
| 2011/0233530 A1 | 9/2011 | Nowatari et al. |
| 2011/0240971 A1* | 10/2011 | Nowatari ............ H01L 51/0078 257/40 |
| 2012/0007071 A1* | 1/2012 | Joo .................... H01L 51/0072 257/40 |
| 2012/0119194 A1 | 5/2012 | Nagai et al. |
| 2012/0261701 A1 | 10/2012 | Yoo et al. |
| 2013/0146850 A1 | 6/2013 | Pieh et al. |
| 2014/0008635 A1 | 1/2014 | Kitagaki et al. |
| 2014/0014937 A1 | 1/2014 | Ide et al. |

FOREIGN PATENT DOCUMENTS

| | | |
|---|---|---|
| CN | 102450101 A | 5/2012 |
| CN | 102484921 A | 5/2012 |
| CN | 103165817 A | 6/2013 |
| JP | 2007-533073 A | 11/2007 |
| JP | 2008-124316 A | 5/2008 |
| JP | 2011-096406 A | 5/2011 |
| JP | 2011096406 A * | 5/2011 |
| KR | 10-2007-0043014 A | 4/2007 |
| KR | 10-2012-0023641 A | 3/2012 |
| TW | 201106515 A | 2/2011 |
| TW | 201301612 A | 1/2013 |
| WO | 2012/046839 A1 | 4/2012 |

* cited by examiner

[Figure 1]
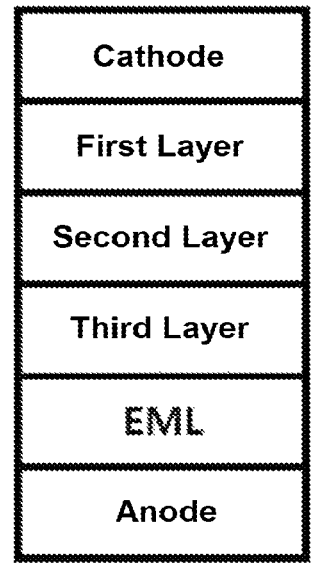
[Figure 2]
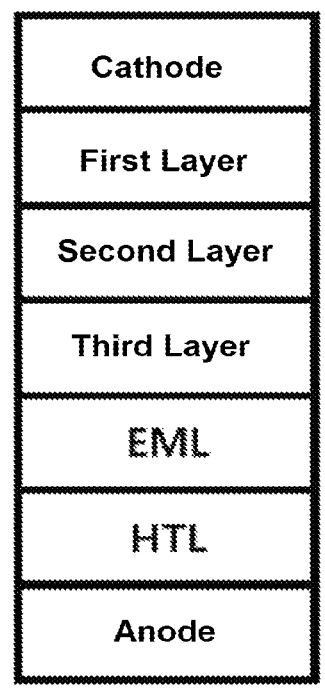

[Figure 3]
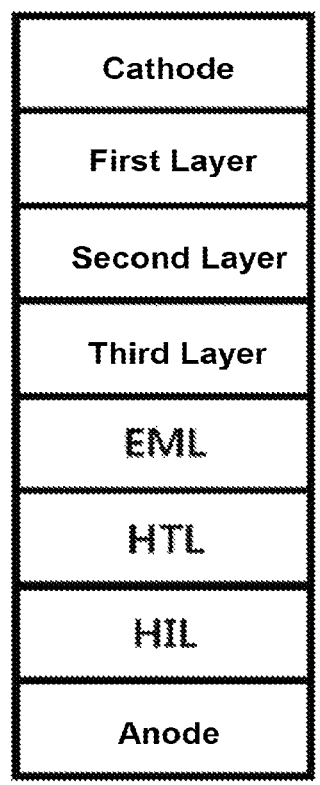

[Figure 4]
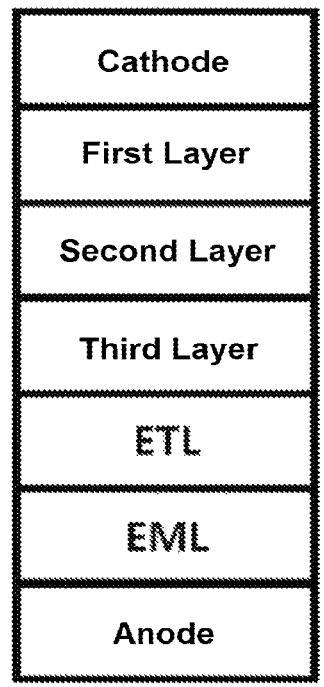
[Figure 5]
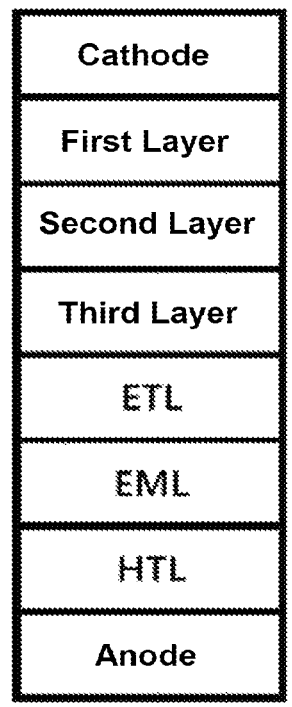

[Figure 6]
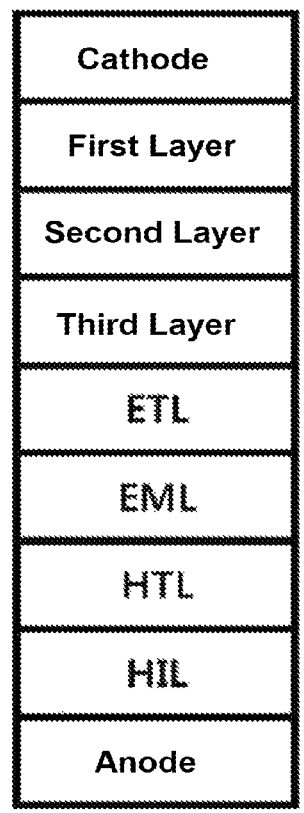

[Figure 7]
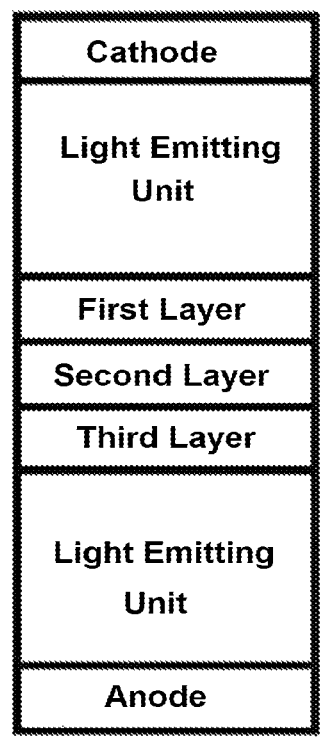

[Figure 8]
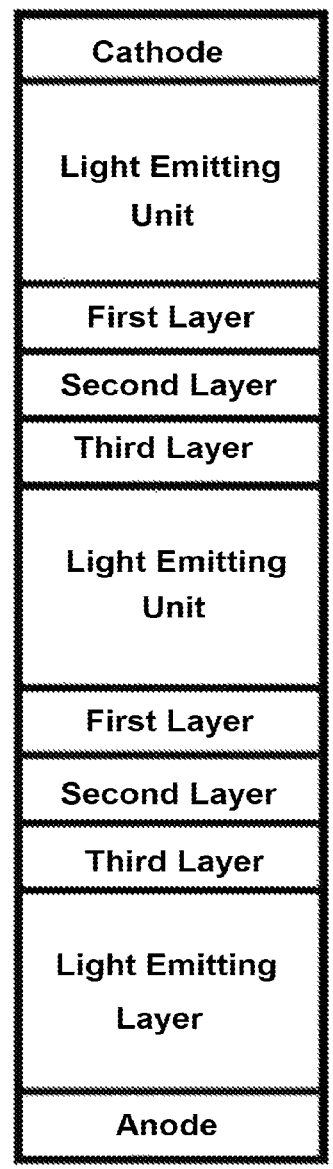

[Figure 9]
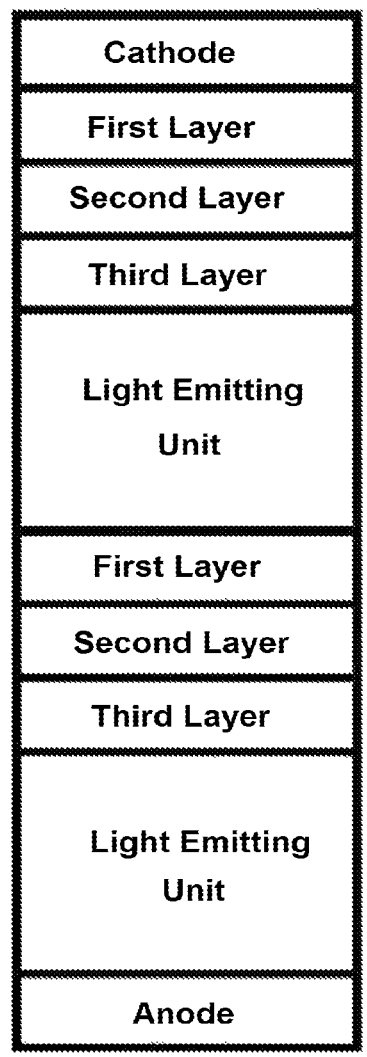

[Figure 10]
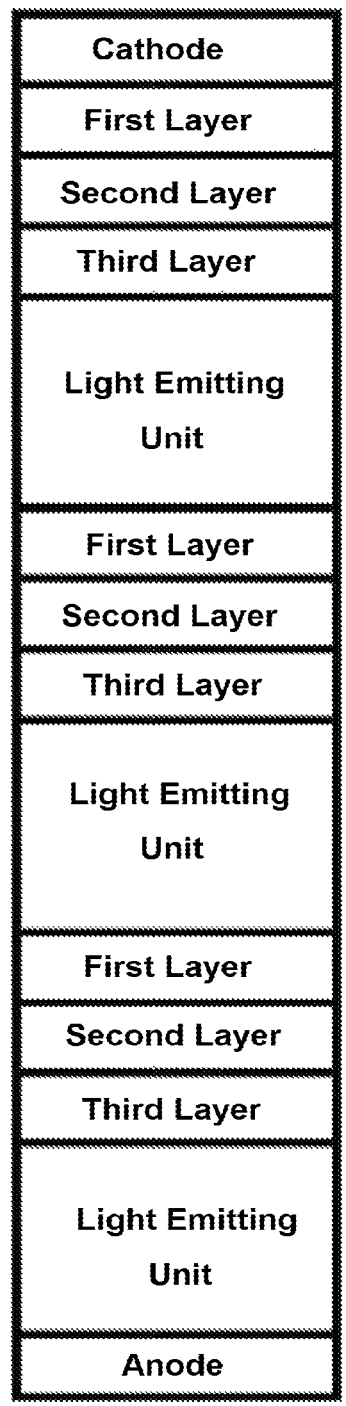

[Figure 11]
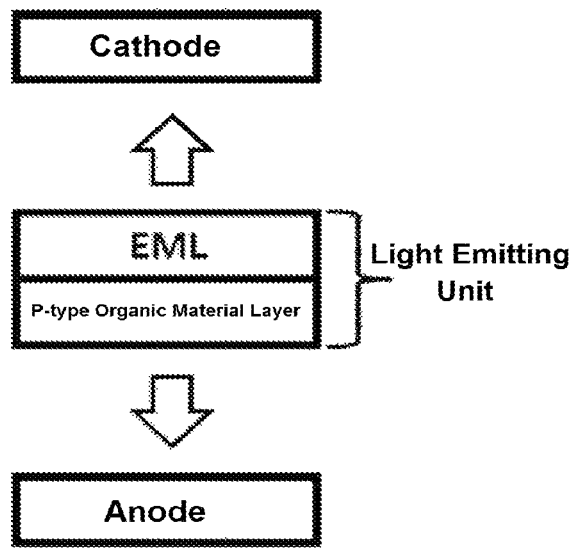
[Figure 12]
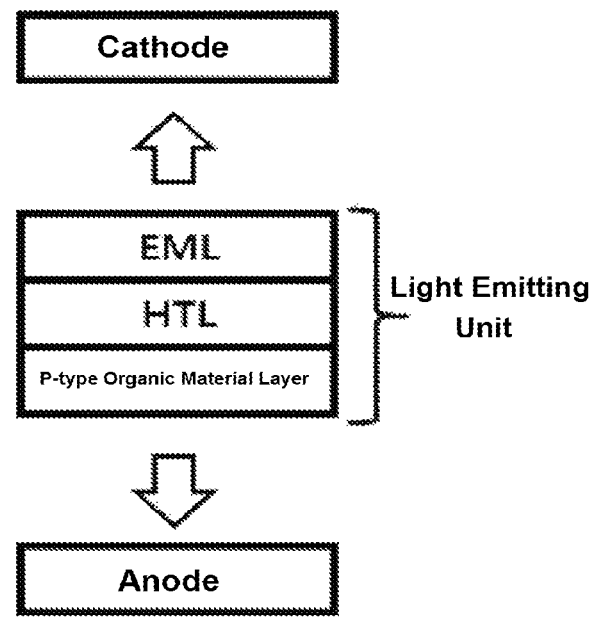

[Figure 13]
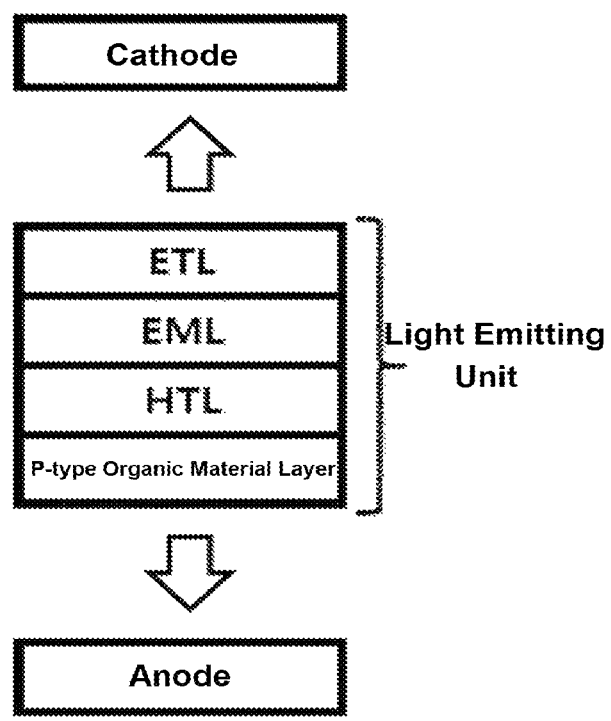

[Figure 14]
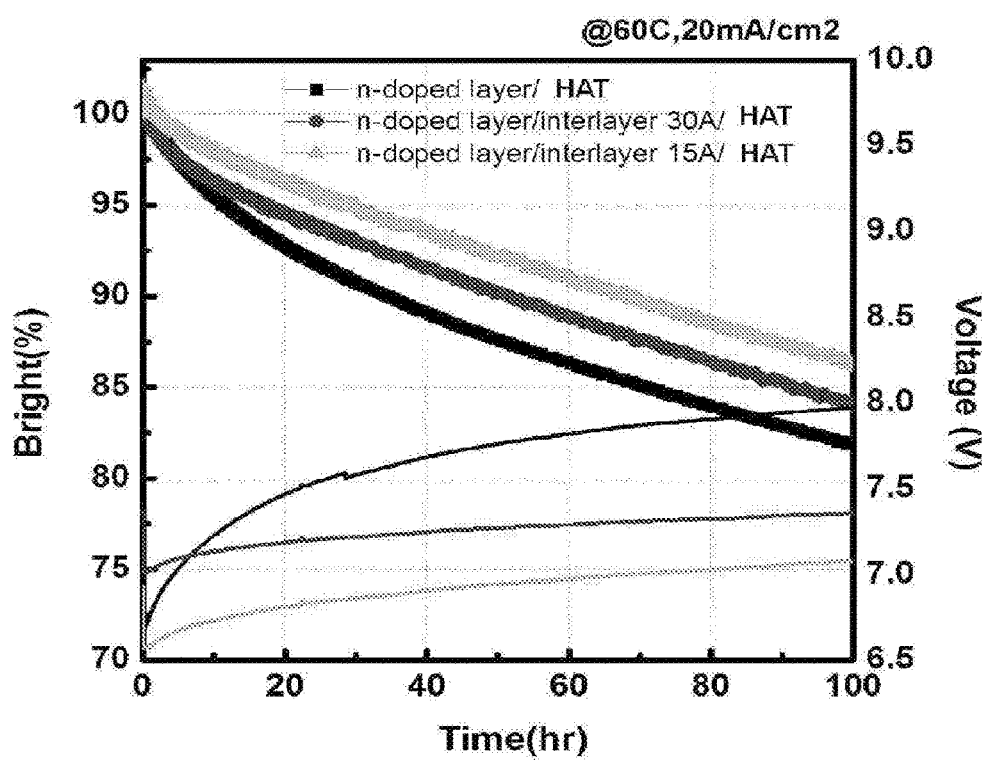

[Figure 15]
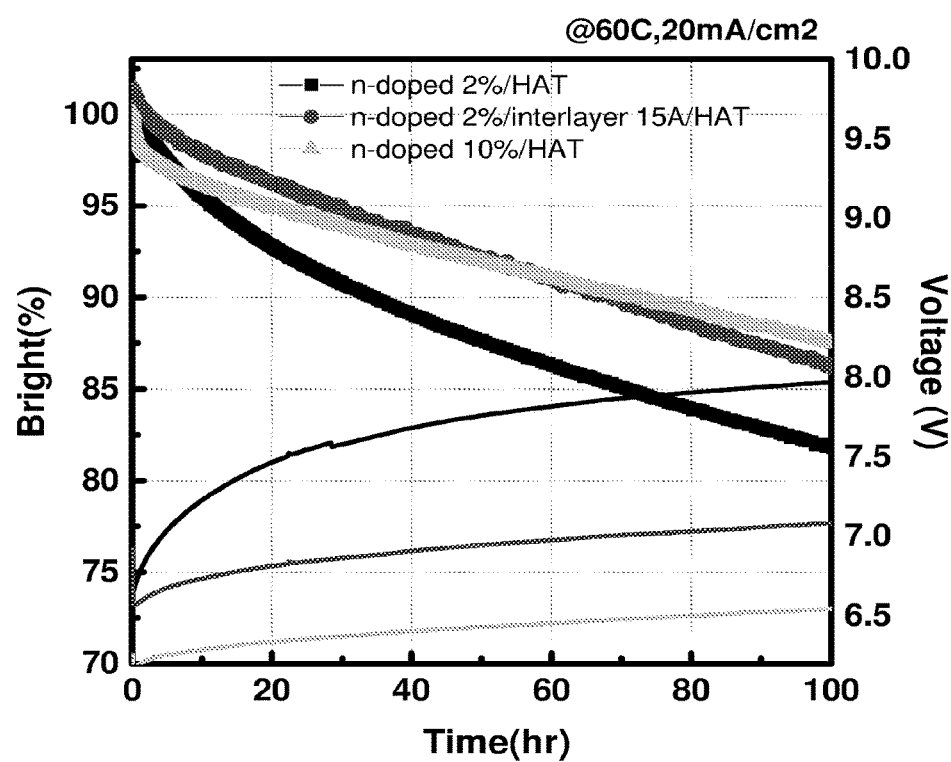

[Figure 16]
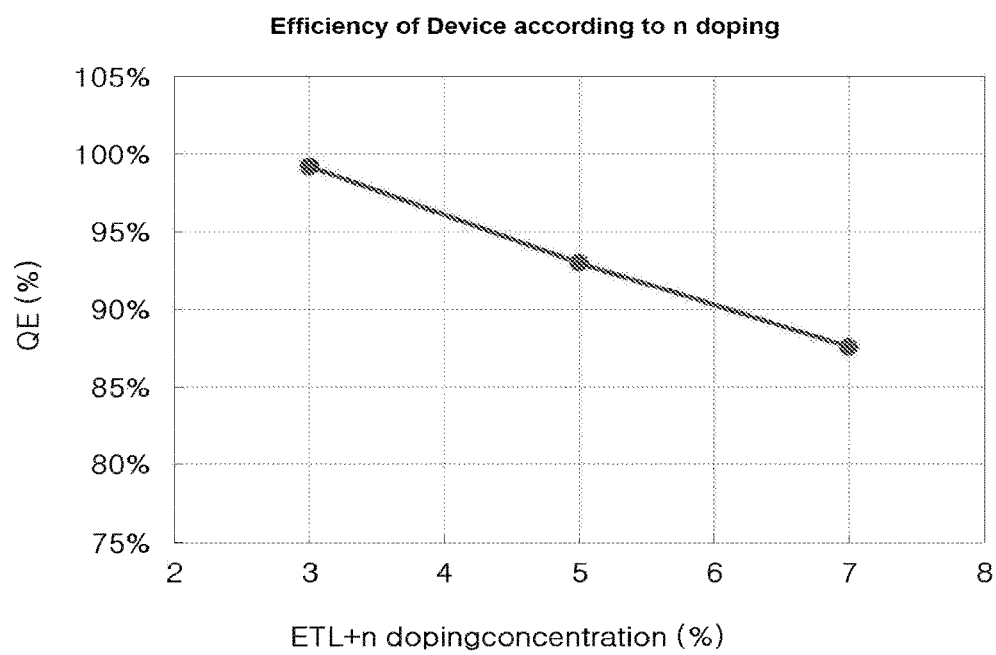

[Figure 17]
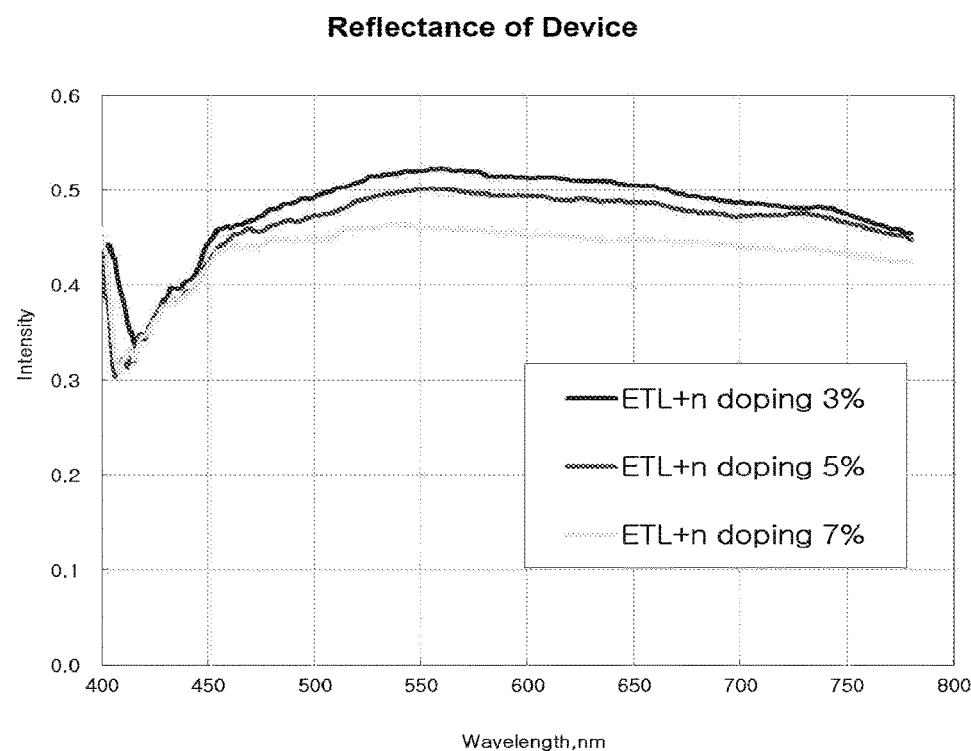

ORGANIC LIGHT-EMITTING ELEMENT

This application is a Continuation of application Ser. No. 14/909,014 filed Jan. 29, 2016, which is a National Stage Application of International Application No. PCT/KR2014/008655, filed on Sep. 17, 2014, which claims the benefit of Korean Patent Application No. KR 10-2013-0112124, filed on Sep. 17, 2013, all of which are hereby incorporated by reference in their entirety for all purposes as if fully set forth herein.

The present application relates to an organic light emitting device.

TECHNICAL FIELD

Background Art

An organic light emitting device injects electrons and holes into an organic material layer from two electrodes to convert a current into a visible ray. The organic light emitting device may have a multilayer structure including two or more organic material layers. For example, the organic light emitting device may further include, in addition to a light emitting layer, if necessary, an electron or hole injection layer, an electron or hole blocking layer, or an electron or hole transport layer.

Recently, according to diversification of the purpose of the organic light emitting device, research on materials that can improve performance of the organic light emitting device has been actively conducted.

Detailed Description of the Invention

Technical Problem

The present inventors have repeatedly studied a method of improving driving stability of an organic light emitting device, resulting in the present invention.

Technical Solution

A first exemplary embodiment of the present application provides an organic light emitting device including: an anode, a cathode provided to face the anode, and a light emitting layer provided between the anode and the cathode, in which the organic light emitting device further includes a first layer, a second layer, and a third layer sequentially provided in a direction from the cathode to the light emitting layer between the cathode and the light emitting layer, the first layer includes an n-type organic material or metal oxide, the second layer includes a barrier material, and the third layer includes an n-type dopant.

A second exemplary embodiment of the present application provides a stacked organic light emitting device including: an anode, a cathode provided to face the anode, and two or more light emitting units provided between the anode and the cathode and including a light emitting layer, in which the stacked organic light emitting device further includes a first layer, a second layer, and a third layer sequentially provided in a direction from the cathode to the anode between the light emitting units, the first layer includes an n-type organic material or metal oxide, the second layer includes a barrier material, and the third layer includes an n-type dopant.

According to another exemplary embodiment of the present application, in the first or second exemplary embodiment, the barrier material of the second layer includes one kind or more of an organic-metal complex, an n-type organic material, and a p-type organic material.

According to another exemplary embodiment of the present application, in the first or second exemplary embodiment, the first layer is formed of one kind of n-type organic material or metal oxide.

According to another exemplary embodiment of the present application, in the first or second exemplary embodiment, the first layer is an undoped layer.

According to another exemplary embodiment of the present application, in the first exemplary embodiment, the organic light emitting device further includes an additional electron transport layer between the third layer and the light emitting layer.

According to another exemplary embodiment of the present application, in the second exemplary embodiment, the organic light emitting device further includes an additional electron transport layer between the third layer and the light emitting layer of the light emitting unit coming into contact with the third layer.

According to another exemplary embodiment of the present application, in the second exemplary embodiment, at least one of the residual light emitting units other than the light emitting unit coming into contact with the anode further includes a p-type organic material layer coming into contact with the first layer.

According to another exemplary embodiment of the present application, in the second exemplary embodiment, the light emitting unit coming into contact with the anode further includes the p-type organic material layer as an organic material layer coming into contact with the anode.

According to another exemplary embodiment of the present application, in the second exemplary embodiment, the light emitting unit coming into contact with the anode further includes a layer of a same material as the first layer as an organic material layer coming into contact with the anode.

According to another exemplary embodiment of the present application, in the second exemplary embodiment, the light emitting unit coming into contact with the cathode further includes the first layer, the second layer, and the third layer sequentially provided in a direction from the cathode to the light emitting layer between the cathode and the light emitting layer.

Advantageous Effects

In an organic light emitting device or a stacked organic light emitting device according to exemplary embodiments described in the present application, it is possible to effectively prevent a chemical reaction occurring at an attachment surface of layers provided between electrodes, an increase in driving voltage by dopant interdiffusion, or device stability.

BRIEF DESCRIPTION OF DRAWINGS

FIGS. 1 to 6 each illustrate a laminate structure of an organic light emitting device according to a first exemplary embodiment of the present application.

FIGS. 7 to 10 each illustrate a laminate structure of a stacked organic light emitting device according to a second exemplary embodiment of the present application.

FIGS. 11 to 13 each illustrate a laminate structure of a light emitting unit of the stacked organic light emitting device according to the second exemplary embodiment of the present application.

FIG. 14 is a graph comparing effects of Examples 1 and 2 and Comparative Example 1 according to an exemplary embodiment of the present application.

FIG. 15 is a graph comparing effects of Example 6 and Comparative Examples 1 and 2 according to the exemplary embodiment of the present application.

FIG. 16 is a graph illustrating efficiency of devices of Examples 3 to 5 according to the exemplary embodiment of the present application.

FIG. 17 is a graph illustrating reflectance of the devices of Examples 3 to 5 according to the exemplary embodiment of the present application.

BEST MODE

Hereinafter, the present invention will be described in detail.

In the present application, an electric charge means an electron or a hole.

In the present application, an n type means an n-type semiconductor property. In other words, an n-type organic material layer is an organic material layer having a property of injecting or transporting electrons at a LUMO energy level, and this is an organic material layer having a property of a material where mobility of electrons is larger than mobility of holes. On the contrary, a p type means a p-type semiconductor property. In other words, a p-type organic material layer is an organic material layer having a property of injecting or transporting the holes at a HOMO (highest occupied molecular orbital) energy level, and this is an organic material layer having a property of a material where mobility of the holes is larger than mobility of the electrons.

In the present application, an n-type dopant means an electron donor material.

In the present application, the energy level means magnitude of energy. Accordingly, in the case where the energy level is represented in a negative (–) direction from a vacuum level, the energy level is interpreted to mean an absolute value of the corresponding energy value. For example, the HOMO energy level means a distance from the vacuum level to the highest occupied molecular orbital. Further, the LUMO energy level means a distance from the vacuum level to a lowest occupied molecular orbital.

In the present application, the term 'undoped' means that a compound constituting a layer is not doped by a compound having the other property. For example, if an 'undoped' layer is formed of a p-type compound, the undoped layer may mean that the layer is not doped with an n-type material. Further, if the 'undoped' layer is an organic material layer, the 'undoped' layer may mean that the layer is not doped with an inorganic material. On the contrary, if the 'undoped' layer is an inorganic material layer such as metal oxide, the 'undoped' layer may mean that the layer is not doped with an organic material. However, since properties of the organic materials having the same property, for example, a p-type property, are similar to each other, two or more organic materials may be used while being mixed. The undoped organic material layer means the case where the layer is formed of only materials having the same kind of property.

In the present application, a light emitting unit means a unit of the organic material layer that can emit light by application of a voltage. The light emitting unit may be formed of only a light emitting layer, but may further include one or more organic material layers in order to inject or transport the electric charge. For example, the light emitting unit may further include at least one of a hole injection layer, a hole transport layer, an electron blocking layer, a hole blocking layer, and an electron transport layer in addition to the light emitting layer.

An organic light emitting device according to a first exemplary embodiment of the present application includes an anode, a cathode provided to face the anode, and a light emitting layer provided between the anode and the cathode, in which the organic light emitting device further includes a first layer, a second layer, and a third layer sequentially provided in a direction from the cathode to the light emitting layer between the cathode and the light emitting layer, the first layer includes an n-type organic material or metal oxide, the second layer includes a barrier material, and the third layer includes an n-type dopant.

The first layer is not particularly limited as long as a material of the first layer can move the electric charges from the cathode to the second layer through a LUMO energy level.

According to an exemplary embodiment of the present application, it is preferable that the first layer have the LUMO energy level of about 4 to 7 eV and electron mobility of about $10^{-8}$ cm$^2$/Vs to 1 cm$^2$/Vs and preferably about $10^{-6}$ cm$^2$/Vs to $10^{-2}$ cm$^2$/Vs.

The n-type organic material layer may be formed of a material that may be deposited under the vacuum or a material that may be subjected to thin film forming by a solution process.

For example, as the material of the first layer, 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, or a compound of the following Chemical Formula 1 may be used.

[Chemical Formula 1]

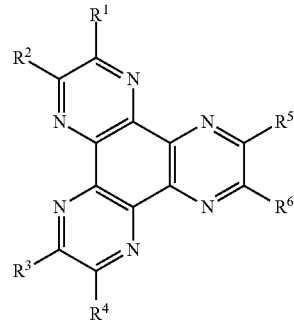

In Chemical Formula 1, $R^1$ to $R^6$ may be each independently hydrogen, a halogen atom, nitrile (—CN), nitro (–NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight- or branch-chained C$_1$-C$_{12}$ alkoxy, substituted or unsubstituted straight- or branch-chained C$_1$-C$_{12}$ alkyl, substituted or unsubstituted straight- or branch-chained C$_2$-C$_{12}$ alkenyl, substituted or unsubstituted aromatic or non-aromatic heterocycle, substituted or unsubstituted aryl, substituted or unsubstituted mono- or di-arylamine, or substituted or unsubstituted aralkylamine, and R and R' may be each substituted or unsubstituted C$_1$-C$_{60}$ alkyl, substituted or unsubstituted aryl, or substituted or unsubstituted 5 to 7-membered heterocycle.

In the aforementioned description, the term "substituted or unsubstituted" means that there is no substitution or substitution is performed by a halogen atom, nitrile (—CN), nitro (—NO₂), sulfonyl (—SO₂R), sulfoxide (—SOR), sulfonamide (—SO₂NR), sulfonate (—SO₃R), trifluoromethyl (—CF₃), ester (—COOR), amide (—CONHR or —CONRR'), straight- or branch-chained $C_1$-$C_{12}$ alkoxy, straight- or branch-chained $C_1$-$C_{12}$ alkyl, straight- or branch-chained $C_2$-$C_{12}$ alkenyl, aromatic or non-aromatic heterocycle, aryl, mono- or di-arylamine, or aralkylamine, and herein, R and R' are each $C_1$-$C_{60}$ alkyl, aryl, or 5 to 7-membered heterocycle.

The compound of Chemical Formula 1 may be exemplified by compounds of the following Chemical Formulas 1-1 to 1-6.

[Chemical Formula 1-1]

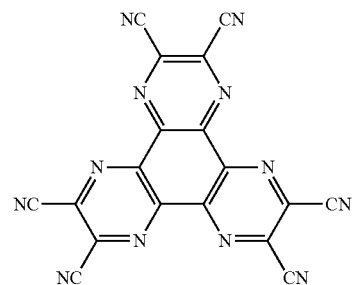

[Chemical Formula 1-2]

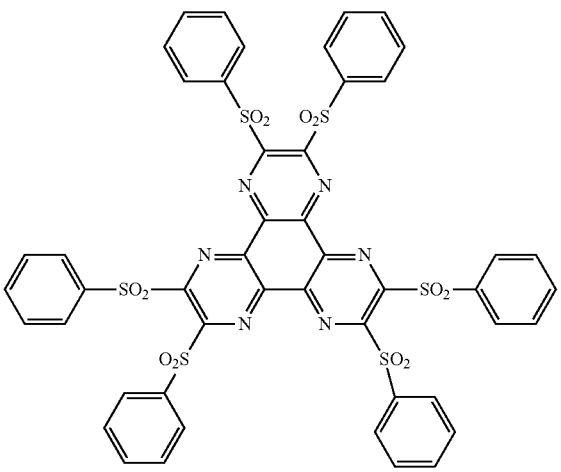

[Chemical Formula 1-3]

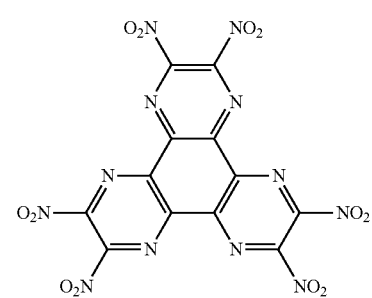

[Chemical Formula 1-4]

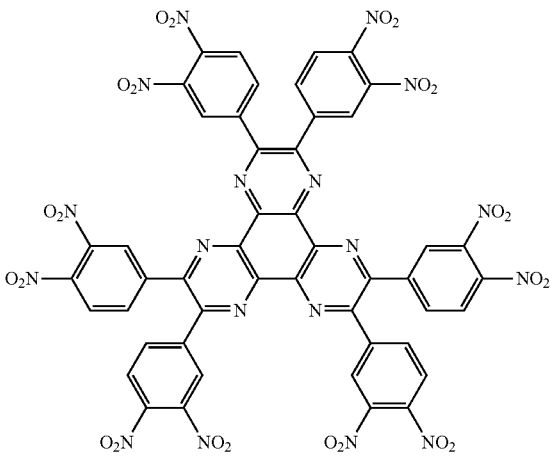

[Chemical Formula 1-5]

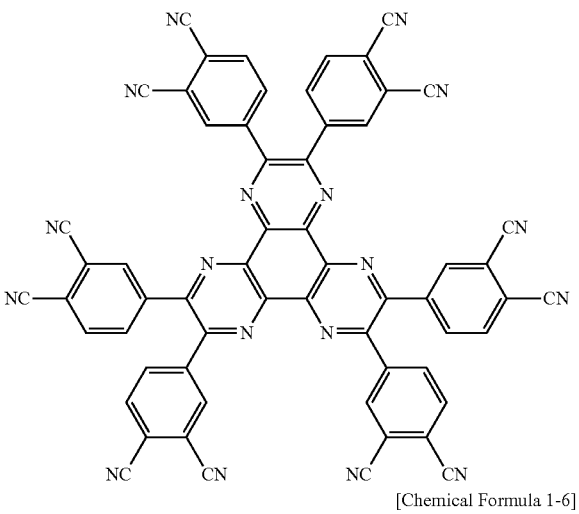

[Chemical Formula 1-6]

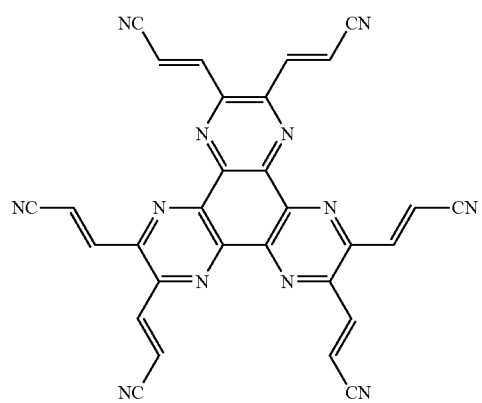

Other examples or synthesis methods and various characteristics of Chemical Formula 1 are described in U.S. Patent Application No. 2002-0158242 and U.S. Pat. Nos. 6,436,559 and 4,780,536, and all contents of the aforementioned documents are included in the present specification.

As another example, metal oxide may be used as the material of the first layer. Examples of metal oxide include molybdenum trioxide ($MoO_3$), $Re_2O_3$, $Al_2O_3$, CuI, $WO_3$, and $V_2O_5$.

As another example, 5,6,11,12-tetraphenylnaphthacene (rubrene) may be used as the material of the first layer.

According to another exemplary embodiment of the present application, in the first exemplary embodiment, the first layer is formed of one kind of n-type organic material or metal oxide.

According to another exemplary embodiment of the present application, in the first or second exemplary embodiment, the first layer is an undoped layer.

According to another exemplary embodiment of the present application, in the first or second exemplary embodiment, the first layer may be a doping layer of an n-type organic material and a p-type organic material.

The third layer includes the n-type dopant.

The third layer may increase a density of an electric charge carrier of the organic material layer by the n-type dopant to improve electric charge transporting efficiency in the device. Accordingly, balancing of the electric charges may be achieved in a light emitting region in the organic light emitting device. Herein, balancing means that densities of the holes and the electrons involved in light emission by recombination in a light emitting region are made identical while being maximized. The organic light emitting device according to the exemplary embodiment of the present specification may have significantly better low voltage, high luminance, and high efficiency properties.

Herein, the n-type dopant is not particularly limited as long as the n-type dopant is an electron donor material. The n-type dopant may be the organic material or the inorganic material. In the case where the n-type dopant is the inorganic material, a metal compound including an alkali metal, for example, Li, Na, K, Rb, Cs, or Fr; an alkali earth metal, for example, Be, Mg, Ca, Sr, Ba, or Ra; a rare earth metal, for example, La, Ce, Pr, Nd, Sm, Eu, Tb, Th, Dy, Ho, Er, Em, Gd, Yb, Lu, Y, or Mn; or one or more metals of the aforementioned metals may be included. Alternatively, as the n-type dopant, an organic material including cyclopentadiene, cycloheptatriene, 6-membered heterocycle, or a condensation cycle including the cycles, specifically, an organic material such as xanthenes, acrydines, diphenylamines, azines, oxazines, thiazines, or thioxanthenes may be used. Further, as the doping organic material, 2,3,5,6-tetrafluoro-7,7,8,8-tetracyanoquinodimethane (F4TCNQ) and the like may be used. In this case, a doping concentration of the n-type dopant may be 30 wt % or less, 10 wt % or less, 0.01 to 30 wt %, 0.01 to 10 wt %, and 0.01 to 5 wt %.

In the third layer, as a host material doped by the n-type dopant, an electron transporting material may be used. Any material can be used without a particular limitation as long as the material is a material used as the electron transporting material in the art. For example, as an example of the host material of the third layer, a compound having a functional group selected from an imidazole group, an oxazole group, a thiazole group, a quinoline group, and a phenanthroline group may be used.

It is preferable that a thickness of the organic material layer of the third layer be less than 500 Å. In the aforementioned thickness range, a reduction in light emitting efficiency may be minimized by absorption of visible rays by the n-type dopant. As one example, the thickness of the third layer is less than 100 Å. As one example, the thickness of the third layer is 10 Å or more.

The second layer includes a barrier material.

The barrier material does not mean a barrier electrically relating to energy but means a physical barrier. The physical barrier refers to a layer physically preventing the n-type dopant doped from the third layer from being diffused. Accordingly, any material can be used without a particular limitation as long as a material that is useful for physically preventing diffusion of the n-type dopant is used as the material of the second layer. Further, since the second layer moves the electrons and carriers by tunneling, wide-ranging materials may be used regardless of the energy level of a layer adjacent to the second layer.

According to disposal of the second layer between the first layer and the third layer, a chemical reaction between the first layer and the third layer or internal diffusion of the dopant may be prevented, and thus an increase in driving voltage may be prevented and stability of the device may be improved.

An example of the barrier material of the second layer includes an organic-metal complex. As an example of the organic-metal complex, a complex of a heavy metal and an organic ligand may be used. Examples of the heavy metal may include Zn, Pt, Ir, and the like. It is preferable that a steric structure of the organic ligand have an elongated shape having any one long axis. In the case where the second layer has the aforementioned organic ligand structure, when the layer is formed, packing may well occur.

Other examples of the barrier material of the second layer include one kind or more of an organic-metal complex, an n-type organic material, and a p-type organic material.

As the n-type organic material, the aforementioned electron transporting material may be used. Further, as the aforementioned p-type organic material, a p-type organic material as will be described later may be used.

A thickness of the second layer may be 1 nm to 3 nm, but is not limited thereto.

According to another exemplary embodiment of the present application, in the first exemplary embodiment, the organic light emitting device further includes an additional electron transport layer between the third layer and the light emitting layer. As a material of the additional electron transport layer, an electron transporting material may be used. Any material may be used without a particular limitation as long as the material is a material used as the electron transporting material in the art.

According to another exemplary embodiment of the present application, the host material of the third layer and the material of the additional electron transport layer may be the same as each other.

According to another exemplary embodiment of the present application, the organic light emitting device may further include one or more organic material layers between the light emitting layer and the anode. For example, the hole injection layer, the hole transport layer, or a layer simultaneously injecting and transporting the holes may be further included.

A laminate structure of the organic light emitting device according to the first exemplary embodiment is illustrated in FIGS. 1 to 6. According to FIG. 1, the anode, the light emitting layer (EML), the third layer, the second layer, the first layer, and the cathode are sequentially laminated. According to FIG. 2, the hole transport layer (HTL) is provided between the light emitting layer (EML) and the anode. According to FIG. 3, the hole transport layer (HTL) and the hole injection layer (HIL) are provided between the light emitting layer (EML) and the anode. According to FIGS. 4 to 6, the additional electron transport layer (ETL) is provided between the third layer and the light emitting layer (EML). However, a lamination order is not limited to the aforementioned lamination order, and if necessary, an additional organic material layer may be further provided.

A stacked organic light emitting device according to the second exemplary embodiment of the present application includes an anode, a cathode provided to face the anode, and two or more light emitting units provided between the anode and the cathode and including a light emitting layer, in which the stacked organic light emitting device further includes a first layer, a second layer, and a third layer sequentially provided in a direction from the cathode to the anode between the light emitting units, the first layer includes an n-type organic material or metal oxide, the second layer includes a barrier material, and the third layer includes an n-type dopant.

The two or more light emitting units may be included. As a specific example, the number of the light emitting units may be 2, 3, 4, or 5.

The stacked organic light emitting devices including two light emitting units and three light emitting units are illustrated in FIGS. 7 and 8, respectively. However, the stacked organic light emitting device is not limited thereto, and may include four or more layers of light emitting units.

The description relating to the first layer, the second layer, and the third layer of the aforementioned first exemplary embodiment may be applied to the first layer, the second layer, and the third layer of the second exemplary embodiment.

According to another exemplary embodiment of the present application, in the second exemplary embodiment, the organic light emitting device further includes an additional electron transport layer between the third layer and the light emitting layer of the light emitting unit coming into contact with the third layer. The description relating to the additional electron transport layer of the aforementioned first exemplary embodiment may be applied to this additional electron transport layer.

According to another exemplary embodiment of the present application, in the second exemplary embodiment, at least one of the residual light emitting units other than the light emitting unit coming into contact with the anode further includes a p-type organic material layer coming into contact with the first layer.

According to another exemplary embodiment of the present application, a difference between the HOMO energy level of the p-type organic material layer and the LUMO energy level of the first layer is 2 eV or less. According to one exemplary embodiment of the present application, the difference between the HOMO energy level of the p-type organic material layer and the LUMO energy level of the first layer may be more than 0 eV and 2 eV or less or more than 0 eV and 0.5 eV or less. According to another exemplary embodiment of the present application, materials of the p-type organic material layer and the first layer may be selected so that the difference between the HOMO energy level of the p-type organic material layer and the LUMO energy level of the first layer is 0.01 eV or more and 2 eV or less.

In the case where the energy difference between the HOMO energy level of the p-type organic material layer and the LUMO energy level of the first layer is 2 eV or less, when the p-type organic material layer and the first layer come into contact with each other, an NP conjunction may easily occur therebetween. In the case where the NP conjunction is formed, the difference between the HOMO energy level of the p-type organic material layer and the LUMO energy level of the first layer is reduced. Accordingly, in the case where a voltage is applied, the holes and the electrons are easily formed from the NP conjunction. In this case, a driving voltage for electron injection may be reduced.

As the material of the p-type organic material layer, an organic material having a p-type semiconductor property may be used. For example, an arylamine-based compound may be used. An example of the arylamine-based compound includes a compound of the following Chemical Formula 2.

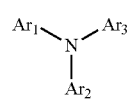

[Chemical Formula 2]

In Chemical Formula 2, $Ar_1$, $Ar_2$, and $Ar_3$ are each independently hydrogen or a hydrocarbon group. In this case, at least one of $Ar_1$, $Ar_2$, and $Ar_3$ may include an aromatic hydrocarbon substituent, individual substituents may be the same as each other, and $Ar_1$, $Ar_2$, and $Ar_3$ may be constituted by different substituents. Among $Ar_1$, $Ar_2$, and $Ar_3$, a matter other than aromatic hydrocarbon may be hydrogen; straight- or branch-chained, or cycloaliphatic hydrocarbon; or a heterocyclic group including N, O, S, or Se.

Specific examples of Chemical Formula 2 include the following Chemical Formulas, but the scope of the exemplary embodiments described in the present specification is not essentially limited thereto.

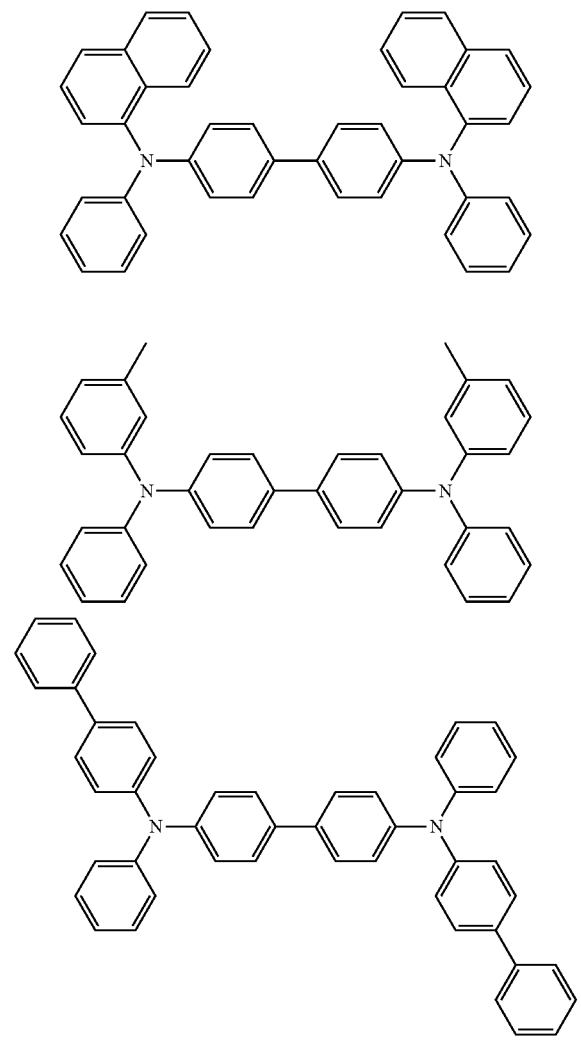

-continued
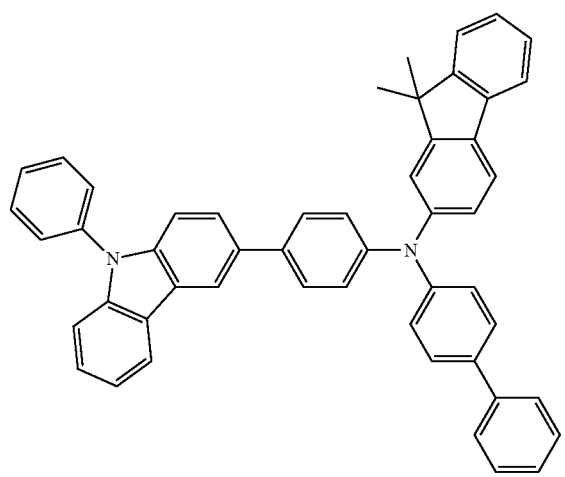
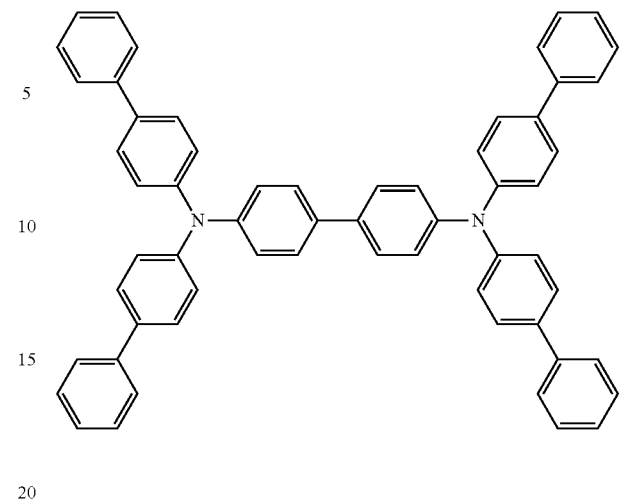
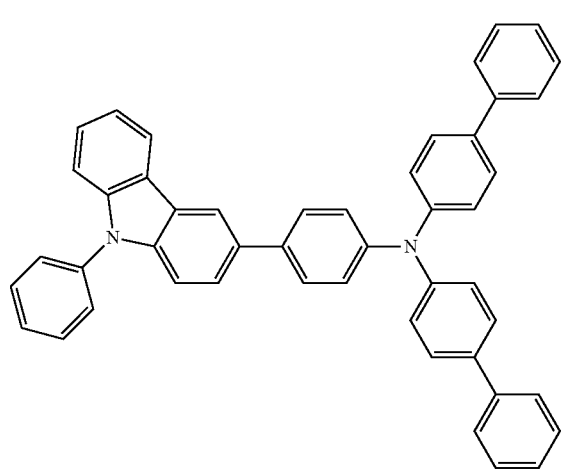
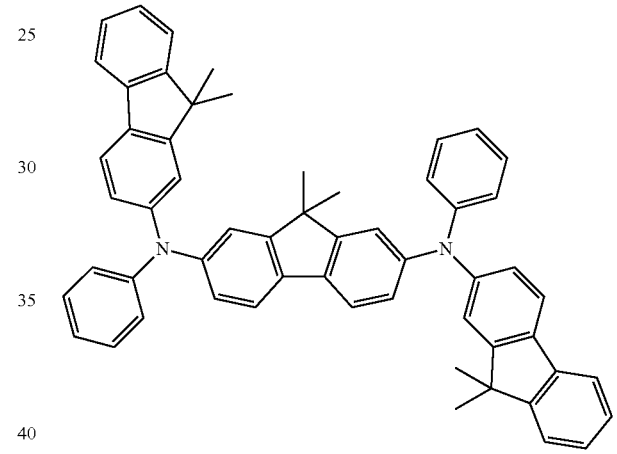
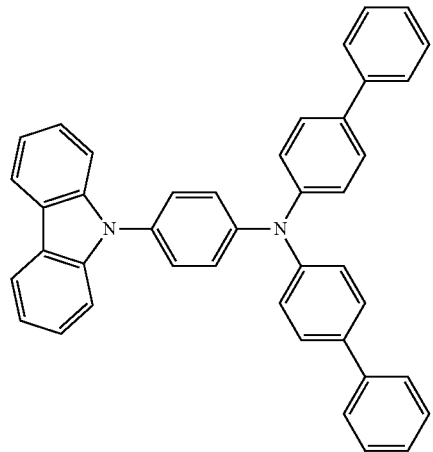
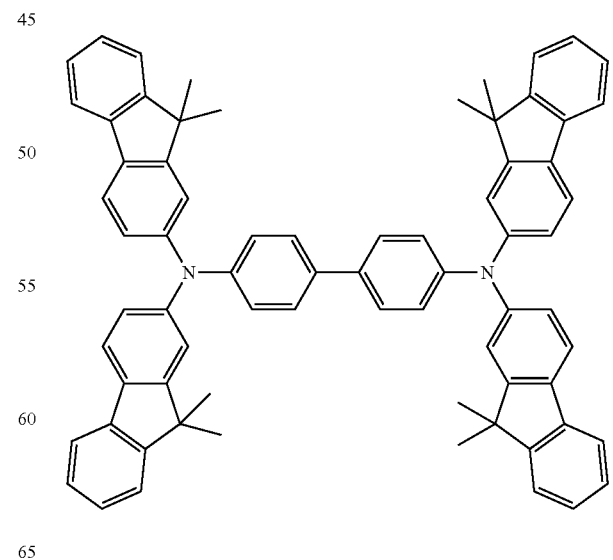

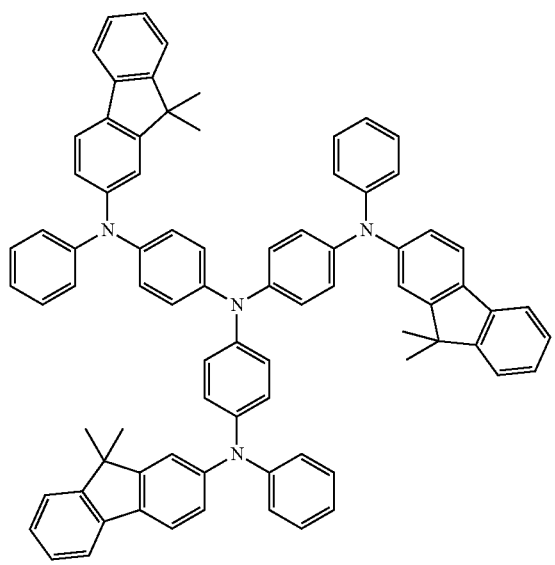
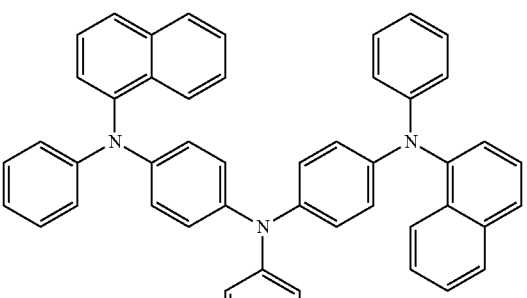
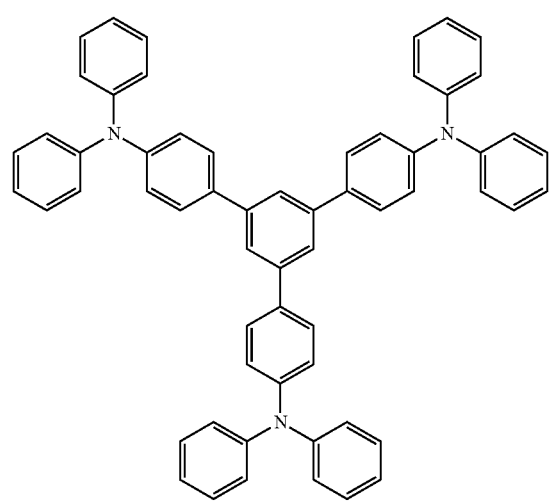
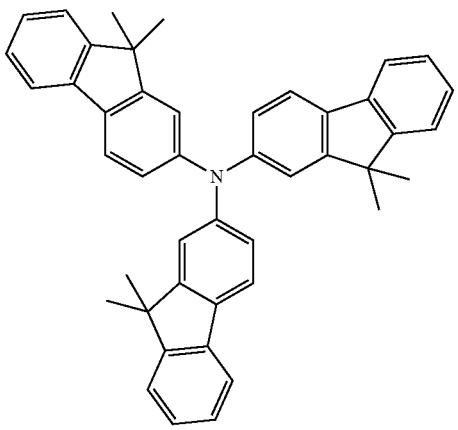
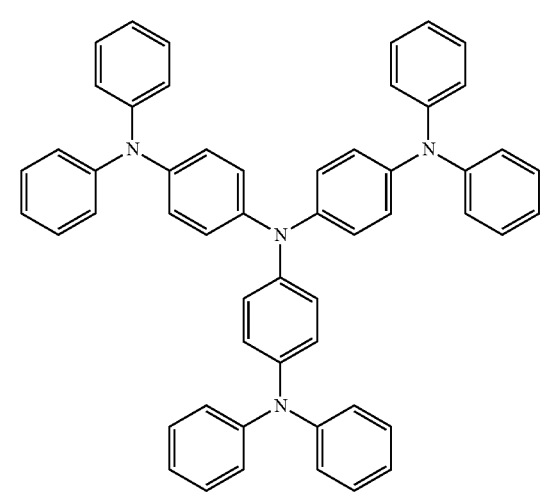
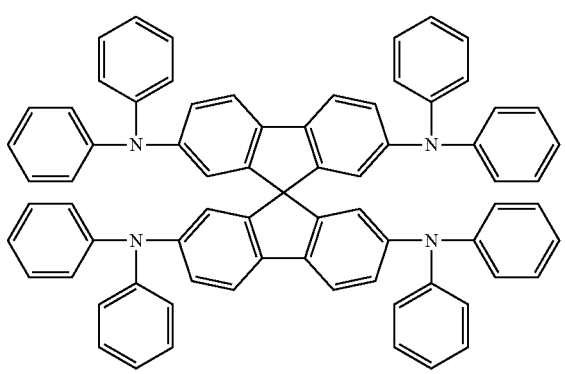

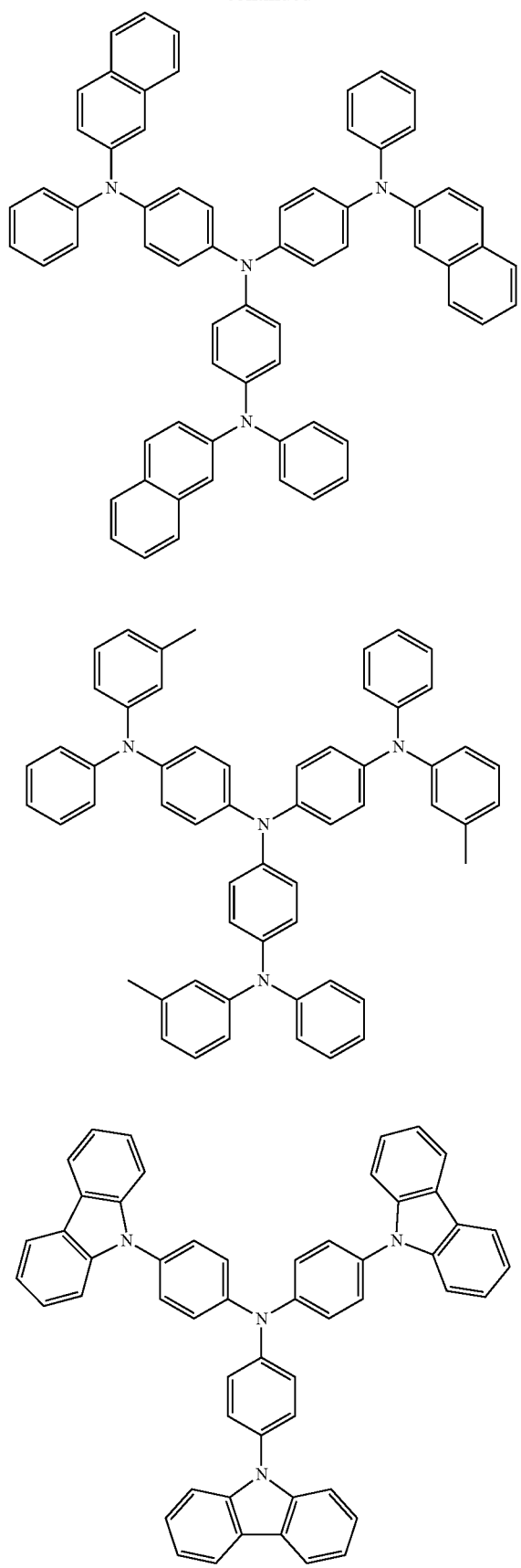
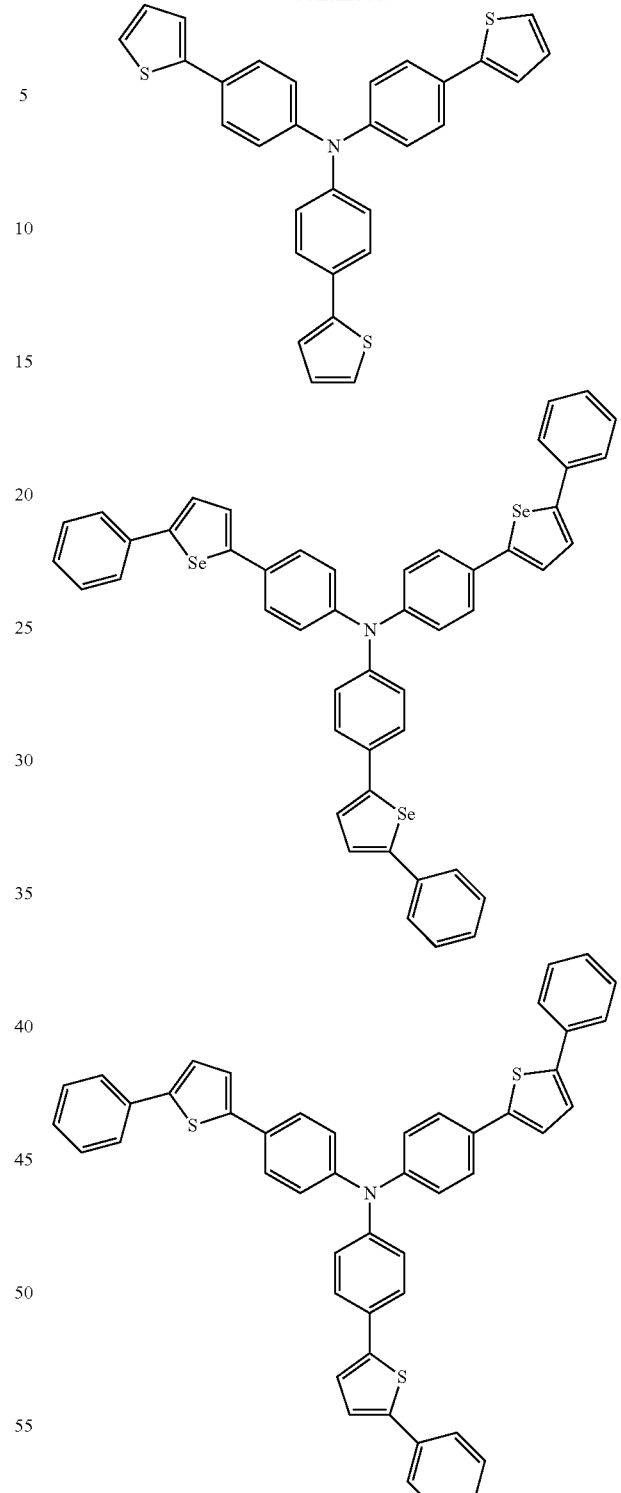

According to another exemplary embodiment of the present application, the p-type organic material layer is undoped.

According to another exemplary embodiment of the present application, in the second exemplary embodiment, the light emitting unit coming into contact with the anode further includes the p-type organic material layer as the organic material layer coming into contact with the anode.

According to another exemplary embodiment of the present application, in the second exemplary embodiment, the light emitting unit coming into contact with the anode further includes a layer of the same material as the first layer as the organic material layer coming into contact with the anode. In this case, a difference between the LUMO energy level of the layer of the same material as the first layer and a work function of the anode material may be adjusted to 4 eV or less. It is preferable that the energy difference be more than 0 eV. In the viewpoint of selection of the material, the material may be selected within about 0.01 to 4 eV. The case where the energy difference is 4 eV or less is useful to exhibit a surface dipole or gap state effect with respect to an energy barrier of hole injection.

According to another exemplary embodiment of the present application, in the second exemplary embodiment, the light emitting unit coming into contact with the cathode further includes the first layer, the second layer, and the third layer sequentially provided in a direction from the cathode to the light emitting layer between the cathode and the light emitting layer.

According to another exemplary embodiment of the present application, in the second exemplary embodiment, the organic light emitting device may further include one or more organic material layers between the anode or the first layer and the light emitting layer. For example, the hole injection layer, the hole transport layer, or the layer simultaneously injecting and transporting the holes may be further included.

FIGS. 11 to 13 illustrate the laminate structure of the light emitting units. FIG. 9 illustrates the light emitting unit including the light emitting layer and the p-type organic material layer, FIG. 10 illustrates the light emitting unit including the light emitting layer, the hole transport layer, and the p-type organic material layer, and FIG. 11 illustrates the light emitting unit including the electron transport layer, the light emitting layer, the hole transport layer, and the p-type organic material layer. However, the light emitting unit is not limited to the aforementioned structures of the drawings, and the light emitting unit may be constituted by excluding a layer other than the light emitting layer or may further include an additional layer.

The other constitution of the organic light emitting device may adopt a technology known in the art. Hereinafter, an example of the electrode is described, but is set forth to illustrate the present invention but is not to be construed to limit the scope of the present invention.

The anode includes a metal, metal oxide, or a conductive polymer. The conductive polymer may include an electric conductive polymer. For example, the anode may have a work function value of about 3.5 to 5.5 eV. Examples of the exemplified conductive material include carbon, aluminum, vanadium, chromium, copper, zinc, silver, gold, other metals, and alloys thereof; zinc oxide, indium oxide, tin oxide, indium tin oxide (ITO), indium zinc oxide, and other similar metal oxides; a mixture of oxides such as ZnO:Al and $SnO_2$:Sb and metals, and the like. As an anode material, a transparent material may be used and an opaque material may be used. In the case of the structure that emits light in an anode direction, the anode may be formed to be transparent. Herein, transparency is feasible if light emitted from the organic material layer can pass therethrough, and transmittance of light is not particularly limited.

For example, in the case where the organic light emitting device according to the present specification is a top emission type and the anode is formed on a substrate before the organic material layer and the cathode are formed, as the anode material, the opaque material having excellent light reflectance as well as the transparent material may be used. For example, in the case where the organic light emitting device according to the present specification is a bottom emission type and the anode is formed on the substrate before the organic material layer and the cathode are formed, as the anode material, the transparent material should be used or the opaque material should be formed of a thin film enough to be made transparent.

In order to adjust a Fermi energy level of the anode, a surface of the anode may be treated by a nitrogen plasma or an oxygen plasma.

The Fermi level of the anode due to plasma treatment is increased during oxygen plasma treatment, and is reduced during nitrogen plasma treatment.

Further, in the case of the nitrogen plasma, conductivity of the anode may be increased, and a surface oxygen concentration may be reduced to generate nitrides on the surface and thus increase a life-span of the device.

As a cathode material, a material having a small work function is generally preferable so that injection of the electrons is easily performed. However, in the case where the first layer is formed to be adjacent to the cathode, the cathode material may be selected from materials having various work functions. For example, a material having a work function of 2 eV to 5 eV may be used as the cathode material. Examples of the cathode include a metal such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

In the case where Al is used as the cathode material, Al may be used alone or may be used together with LiF or Liq to provide a device that can be effectively operated. Particularly, in the case where Ag is used as the cathode material, in the device according to the related art, when Ag is used alone or is used together with LiF or Liq, since the device is not well operated, a layer formed of a metal such as an alkali metal or an alkali earth metal or an organic material layer doped with a metal should be used as the organic material layer adjacent to the cathode. However, in the exemplary embodiment described in the present application, as described above, a material having a large work function such as Ag may be used as the cathode material without the metal layer or the organic material layer doped with the metal. Further, in the exemplary embodiment described in the present application, transparent conductive oxide having a large work function such as IZO (work function of 4.8 to 5.2 eV) may be used as the cathode material.

In the existing organic light emitting device, in the case where the cathode of the material having the large work function such as Al or Ag is used, a metal needs to be doped in an inorganic material layer such as a LiF layer between the organic material layer and the cathode, or the organic material layer. In the related art, the aforementioned inorganic material layer or the organic material layer doped with the metal is not used, and in the case where the cathode and the organic material layer come into contact with each other, only the material having the work function of 2 eV or more and less than 3.5 eV can be used as the cathode material. However, in the organic light emitting device according to the present application, in the case where the cathode comes into contact with the organic material layer, the cathode may be constituted by using the material having the work function of 3.5 eV or more by a first p-type organic material layer and a first n-type organic material layer.

According to the exemplary embodiment of the present application, the cathode is provided to physically come into contact with the organic material layer, and is constituted by the material having the work function of 3.5 eV or more.

According to the exemplary embodiment of the present application, the cathode is provided to physically come into contact with the organic material layer, and is constituted by the material having the work function of 4 eV or more.

According to the exemplary embodiment of the present application, the cathode is provided to physically come into contact with the organic material layer, and is constituted by the material having the work function of 4.5 eV or more.

An upper limit of the work function of the material constituting the cathode is not particularly limited, but in the viewpoint of selection of the material, the material having the work function of 5.5 eV or less may be used.

The cathode may be formed of the same material as the anode. In this case, the cathode may be formed of the materials exemplified as the anode material. Alternatively, the cathode or the anode may include a transparent material.

The organic light emitting device according to the exemplary embodiment of the present application may be a device including a light extraction structure.

In the exemplary embodiment of the present application, the organic light emitting device further includes a substrate on a surface facing a surface on which the organic material layer of the anode or the cathode is provided, and further includes a light extraction layer between the substrate and the anode or the cathode, or on a surface facing a surface on which the anode or the cathode of the substrate is provided.

In other words, the organic light emitting device may further include an internal light extraction layer between the substrate provided on the surface facing the surface on which the organic material layer of the anode or the cathode is provided and the anode or the cathode. In another exemplary embodiment, an external light extraction layer may be further provided on an opposite surface of the surface on which the anode or the cathode is provided in the substrate.

In the present application, the internal light extraction layer or the external light extraction layer is not particularly limited as long as the internal light extraction layer or the external light extraction layer has a structure that can induce light scattering to improve light extraction efficiency of the device. In one exemplary embodiment, the light extraction layer may be formed by using a film having a structure where scattering particles are dispersed in a binder or having unevenness.

Further, the light extraction layer may be directly formed on the substrate by a method such as spin coating, bar coating, and slit coating, or may be formed by a method where the light extraction layer is manufactured in a film form, followed by attachment.

The internal light extraction layer or the external light extraction layer may further include a flat layer.

In the exemplary embodiment of the present application, the organic light emitting device is a flexible organic light emitting device. In this case, the substrate includes a flexible material. For example, a substrate having a thin film type of glass, plastic, or film that can be bent may be used.

A material of the plastic substrate is not particularly limited, but in general, a film such as PET, PEN, PEEK, and PI may be used in a single layer or multilayer form.

In the exemplary embodiment of the present application, a display apparatus including the organic light emitting device is provided. In the display apparatus, the organic light emitting device may serve as a pixel or a backlight. As the other constitution of the display apparatus, matters known in the art may be applied.

In the exemplary embodiment of the present application, a lighting apparatus including the organic light emitting device is provided. In the lighting apparatus, the organic light emitting device serves as a light emitting portion. As other constitutions required in the lighting apparatus, matters known in the art may be applied.

Hereinafter, effects of the aforementioned exemplary embodiments will be exemplified through the Examples. However, the scope of the present invention is not intended to be limited thereto.

EXAMPLE

Example 1

The transparent anode was formed with ITO in the thickness of 1,000 Å on the substrate by the sputtering method, HAT was thermally deposited under the vacuum to form the n-type organic material in the thickness of 500 Å thereon, and NPB of the following Chemical Formula was deposited under the vacuum to form the hole transport layer having the thickness of 400 Å thereon and thus form the NP conjunction. In addition, Ir(ppy)$_3$ of the following Chemical Formula was doped into CBP of the following Chemical Formula in the amount of 10 wt %, and the light emitting layer having the thickness of 300 Å was constituted by the doped organic layer. In addition, BAlq that was the hole blocking layer material of the following Chemical Formula was formed thereon in the thickness of 50 Å. The electron transport material of the following Chemical Formula was formed in the thickness of 150 Å thereon, and the third layer that was the electron transport layer doped by doping Ca to the electron transport material of the following Chemical Formula in the amount of 10 wt % was formed in the thickness of 50 Å thereon. Subsequently, the layer having the thickness of 30 Å was formed as the second layer by using the CuPc material. Subsequently, the HAT (first layer)/NPB/CBP+Ir(ppy)$_3$/BAlq/ETL/Ca+ETL unit device structure was further formed on the second layer by the aforementioned method. Aluminum was formed in the thickness of 1,000 Å as the cathode on the doped Ca electron transport layer to manufacture the laminated organic light emitting device.

In the aforementioned process, the deposition speed of the organic material was maintained at 0.5 to 1.0 Å/sec, and the degree of vacuum during deposition was maintained at about $2 \times 10^{-8}$ to $2 \times 10^{-7}$ torr.

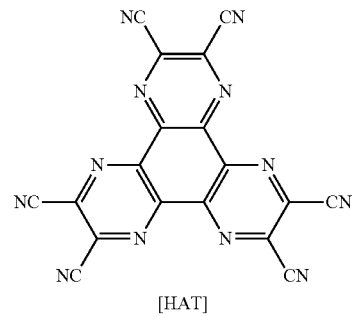

[HAT]

-continued

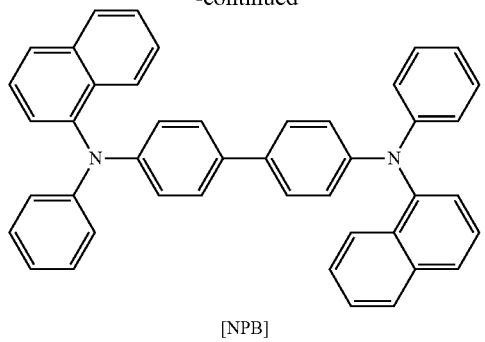
[NPB]

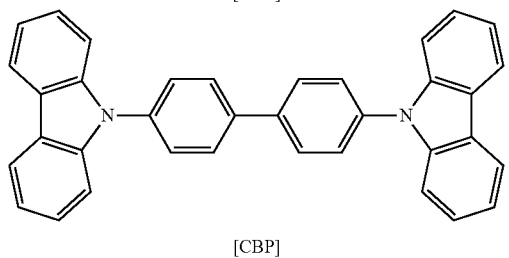
[CBP]

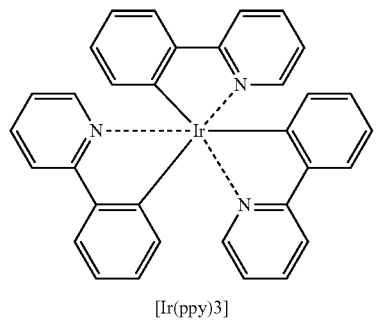
[Ir(ppy)3]

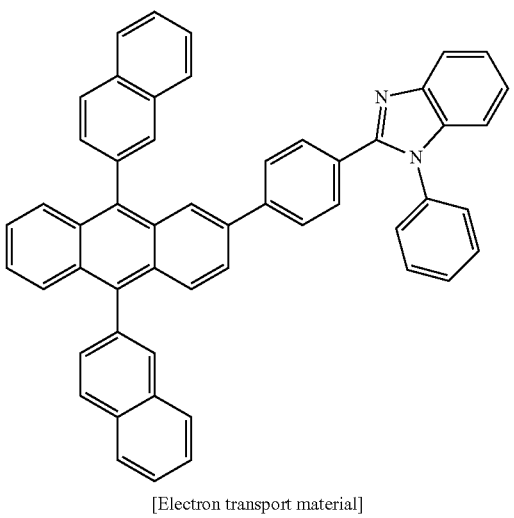
[Electron transport material]

Example 2

The stacked organic light emitting device was manufactured by performing the same procedure as Example 1, except that the thickness of the second layer was 15 Å.

Example 3

The stacked organic light emitting device was manufactured by performing the same procedure as Example 1, except that the doping concentration of Ca of the third layer was 7 wt %.

Example 4

The stacked organic light emitting device was manufactured by performing the same procedure as Example 1, except that the doping concentration of Ca of the third layer was 5 wt %.

Example 5

The stacked organic light emitting device was manufactured by performing the same procedure as Example 1, except that the doping concentration of Ca of the third layer was 3 wt %.

Example 6

The stacked organic light emitting device was manufactured by performing the same procedure as Example 1, except that the doping concentration of Ca of the third layer was 2 wt %.

Comparative Example 1

The stacked organic light emitting device was manufactured by performing the same procedure as Example 1, except that the second layer was not formed.

Comparative Example 2

The stacked organic light emitting device was manufactured by performing the same procedure as Example 3, except that the second layer was not formed.

Experimental Example

In order to confirm reliability of the manufactured organic light emitting device, the difference between the initial voltage of 0 hr and the voltage after 200 hr was measured under the driving condition of 60° C. and 20 mA/cm$^2$, and is shown in the following Table 1 and FIG. 14.

TABLE 1

| No. | Life time (100 hr) | $V_{100\ hr}$-$V_{0\ hr}$ |
|---|---|---|
| Comparative Example 1 | 81.8% | 1.33 V |
| Example 1 | 84.1% | 0.34 V |
| Example 2 | 86.3% | 0.51 V |

Like the aforementioned result, as compared to Comparative Example 1, in the experiments under the aforementioned condition in Examples 1 and 2, the voltage increase problem was improved. Further, in Example 1, the thickness of the second layer was larger as compared to Example 2, and in this case, bigger improvement was exhibited.

Further, in order to confirm reliability of the manufactured organic light emitting device, the difference between the initial voltage of 0 hr and the voltage after 200 hr with respect to Example 6 and Comparative Examples 1 and 2 was measured under the driving condition of 60° C. and 20 mA/cm$^2$, and is illustrated in the following FIG. 15.

Further, with respect to Examples 3 to 5, efficiency of the device according to the doping concentration of the n-type dopant of the third layer was measured and is illustrated in the following FIG. 16, and reflectance of the device was measured to be illustrated in the following FIG. 17.

Like the aforementioned result, as the doping concentration of the n-type dopant of the third layer is increased, absorption is increased, and thus efficiency of the device may be reduced. However, according to the present application, by including the second layer including the barrier material, the doping concentration of the n-type dopant of the third layer can be adjusted to 30 wt % or less, 10 wt % or less, or 5 wt %, and a chemical reaction generated on an attachment surface of the layers provided between the electrodes, an increase in driving voltage by dopant inter-diffusion, or stability of the device can be effectively prevented.

The invention claimed is:

1. A organic light emitting device comprising:
   an anode,
   a cathode provided to face the anode,
   two or more light emitting units provided between the anode and the cathode and including a light emitting layer, and
   two or more balancing units including a first layer, a second layer, and a third layer sequentially provided in a direction from the cathode to the anode,
   wherein at least one of the balancing units is provided between the light emitting units,
   wherein the first layer has a LUMO energy level of 4 eV to 7 eV, and
   wherein the first layer includes an n-type organic material or metal oxide, the second layer includes a barrier material, and the third layer includes an n-type dopant.

2. The organic light emitting device of claim 1, wherein the barrier material of the second layer includes one kind or more of an organic-metal complex, a n-type organic material, and a p-type organic material.

3. The organic light emitting device of claim 1, wherein the first layer is an undoped layer.

4. The organic light emitting device of claim 1, wherein the first layer includes 2,3,5,6-tetrafluoro-7,7,8,8-tetracyanoquinodimethane (F4TCNQ), fluorine-substituted 3,4,9,10-perylenetetracarboxylic dianhydride (PTCDA), cyano-substituted PTCDA, naphthalenetetracarboxylic dianhydride (NTCDA), fluorine-substituted NTCDA, cyano-substituted NTCDA, a compound of the following Chemical Formula 1, $MoO_3$, $Re_2O_3$, $Al_2O_3$, CuI, $WO_3$, $V_2O_5$, or 5,6,11,12-tetraphenylnaphthacene (rubrene):

[Chemical Formula 1]

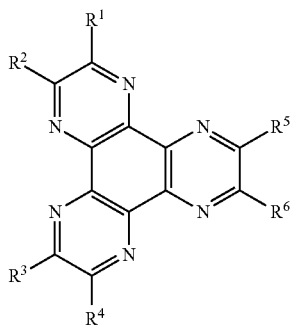

in Chemical Formula 1, $R^1$ to $R^6$ are each hydrogen, a halogen atom, nitrile (—CN), nitro (—$NO_2$), sulfonyl (—$SO_2R$), sulfoxide (—SOR), sulfonamide (—$SO_2NR$), sulfonate (—$SO_3R$), trifluoromethyl (—$CF_3$), ester (—COOR), amide (—CONHR or —CONRR'), substituted or unsubstituted straight- or branch-chained $C_1$-$C_{12}$ alkoxy, substituted or unsubstituted straight- or branch-chained $C_1$-$C_{12}$ alkyl, substituted or unsubstituted straight- or branch-chained $C_2$-$C_{12}$ alkenyl, substituted or unsubstituted aromatic or non-aromatic heterocycle, substituted or unsubstituted aryl, substituted or unsubstituted mono- or di-arylamine, or substituted or unsubstituted aralkylamine, and R and R' are each substituted or unsubstituted $C_1$-$C_{60}$ alkyl, substituted or unsubstituted aryl, or substituted or unsubstituted 5 to 7-membered heterocycle.

5. The organic light emitting device of claim 1, wherein densities of the holes and the electrons involved in light emission by recombination in the light emitting units are made identical by the balancing units.

6. The organic light emitting device of claim 1, wherein densities of the holes and the electrons involved in light emission by recombination in the light emitting units are made identical by the third layer.

7. The organic light emitting device of claim 1, wherein a doping concentration of the n-type dopant of the third layer is 30 wt % or less.

8. The organic light emitting device of claim 1, wherein a doping concentration of the n-type dopant of the third layer is 10 wt % or less.

9. The organic light emitting device of claim 1, further comprising:
   an additional electron transport layer between the third layer of the balancing unit and the light emitting layer of the light emitting unit coming into contact with the third layer.

10. The organic light emitting device of claim 1, wherein at least one of the residual light emitting units other than the light emitting unit coming into contact with the anode further includes a p-type organic material layer coming into contact with the first layer of the balancing unit.

11. The organic light emitting device of claim 10, wherein a difference between a LUMO energy level of the first layer and a HOMO energy level of the p-type organic material layer is 2 eV or less.

12. The organic light emitting device of claim 1, wherein the first layer has electron mobility of $10^{-8}$ $cm^2/Vs$ to 1 $cm^2/Vs$.

13. The organic light emitting device of claim 1, wherein the light emitting unit coming into contact with the anode further includes a layer of a same material as at least one of the first layer of the balancing unit as an organic material layer coming into contact with the anode.

14. The organic light emitting device of claim 13, wherein a difference between a LUMO energy level of the layer of the same material as the first layer and a work function of the anode is 4 eV or less.

15. The organic light emitting device of claim 1, wherein at least one of the balancing units is provided between the cathode and the light emitting unit adjacent to the cathode.

16. The organic light emitting device of claim 1, wherein at least one of the light emitting units is provided between the balancing units, and emits blue light.

17. The organic light emitting device of claim 1, wherein at least one of the light emitting units is provided between the anode and the balancing unit adjacent to the anode, and emits light of a color other than blue.

18. The organic light emitting device of claim 1, wherein at least one of the light emitting units is provided between the cathode and the balancing unit adjacent to the cathode, and emits light of a color other than blue.

19. The organic light emitting device of claim 1, wherein one of the light emitting units is provided between the anode and the balancing unit adjacent to the anode, a remaining one of the light emitting units is provided between the cathode and the balancing unit adjacent to the cathode, and
   wherein the one of the light emitting units and the remaining one of the light emitting units emit light of same color.

20. The organic light emitting device of claim 19, wherein the same color is green, red or a combination thereof.

21. The organic light emitting device of claim 1, further comprising:
   a substrate provided on an opposite surface of a surface of the cathode or the anode, on which the organic material layer is provided, and
   a light extraction layer provided between the cathode or the anode and the substrate.

22. The organic light emitting device of claim 1, further comprising:
   a substrate provided on an opposite surface of a surface of the cathode or the anode, on which the organic material layer is provided, and
   a light extraction layer provided on an opposite surface of a surface of the substrate, on which the anode or the cathode is provided.

23. The organic light emitting device of claim 1, wherein the organic light emitting device is a flexible organic light emitting device.

24. A display comprising:
   the organic light emitting device of claim 1.

25. A lighting comprising:
   the organic light emitting device of claim 1.

* * * * *